United States Patent
Kang et al.

(10) Patent No.: US 7,459,846 B2
(45) Date of Patent: Dec. 2, 2008

(54) RED PHOSPHOR AND METHOD OF PREPARING THE SAME, AND RED LIGHT EMITTING DIODE, WHITE LIGHT EMITTING DIODE, AND ACTIVE DYNAMIC LIQUID CRYSTAL DEVICE USING THE RED PHOSPHOR

(75) Inventors: Yun-chan Kang, Daejeon-si (KR);
Jae-hee Cho, Gyeonggi-do (KR);
Cheol-soo Sone, Gyeonggi-do (KR)

(73) Assignees: Samsung Electro-Mechanics Co., Ltd., Suwon-Si, Gyeonggi-Do (KR); Korea Research Institute of Chemical Technology, Yuseong-Gu, Daejeon-Si (KR)

( * ) Notice: Subject to any disclaimer, the term of this patent is extended or adjusted under 35 U.S.C. 154(b) by 750 days.

(21) Appl. No.: 10/976,875

(22) Filed: Nov. 1, 2004

(65) Prior Publication Data

US 2005/0093816 A1    May 5, 2005

(51) Int. Cl.
*H01J 1/62*    (2006.01)
*H01J 63/04*   (2006.01)
(52) U.S. Cl. .............. 313/503; 313/498; 252/301.4 R
(58) Field of Classification Search ............ 313/498, 313/502, 503, 506, 512; 252/301.4 R, 301.4 F, 252/301.4 H
See application file for complete search history.

(56) References Cited

U.S. PATENT DOCUMENTS

2004/0245532 A1    12/2004  Maeda et al.
2006/0017365 A1*   1/2006   Nagatomi et al. .......... 313/485

FOREIGN PATENT DOCUMENTS

| JP | 52-010881   |    | 1/1977 |
| JP | 4-104099    | A  | 4/1992 |
| JP | 2003-41252  | A  | 2/2003 |
| KR | 2003-0033864| A  | 5/2003 |
| WO | 03/018713   | A1 | 3/2003 |
| WO | 03/032407   | A1 | 4/2003 |

OTHER PUBLICATIONS

Cheng-Huang Kuo et al., "n-UV+Blue/Green/Red White Light Emitting Diode Lamps," *Japan J. Appl. Phys.*, Apr. 2003, pp. 2284-2287, vol. 42.

(Continued)

*Primary Examiner*—Joseph L. Williams
*Assistant Examiner*—Kevin Quarterman
(74) *Attorney, Agent, or Firm*—Buchanan, Ingersoll & Rooney PC

(57) ABSTRACT

Provided is a red phosphor represented by formula 1:

$$(Li_{(2-z)-x}M_x)(MoO_4)_y:Eu_z,Sm_q \qquad (1)$$

where M is an element selected from K, Mg, Na, Ca, Sr, and Ba, $0 \leq x \leq 2$, $0.5 \leq y \leq 5$, $0.01 \leq z \leq 1.5$, and $0.001 \leq q \leq 1.0$. The red phosphor has emission characteristics such as high brightness when excited by, in particular, an excitation light source of around 405 nm. The red phosphor is 6 times brighter than conventional phosphors. Furthermore, the red phosphor can be used in a red light emitting diode (LED) that has a UV excitation light source, a white LED, and an active dynamic liquid crystal device (LCD). In addition, the white LED using the red phosphor has a color rendering index of 90 or greater and so has excellent color rendition.

9 Claims, 5 Drawing Sheets

OTHER PUBLICATIONS

J.K. Sheu et al., "White-Light Emission from Near UV InGaN-GaN LED Chip Precoated with Blue/Green/Red Phosphors," *IEEE Photonics Technology Letters*, Jan. 2003, pp. 18-20, vol. 15, No. 1.

European Search Report for EP 04 25 6679, dated Feb. 8, 2005.

Official Action issued by the Japanese Patent Office in corresponding JP Patent Application No. 2004-316453, Jun. 12, 2007; and English translation thereof.

Office Action from Chinese Intellectual Property Office dated Apr. 4, 2008, with translation.

* cited by examiner

RED PHOSPHOR AND METHOD OF PREPARING THE SAME, AND RED LIGHT EMITTING DIODE, WHITE LIGHT EMITTING DIODE, AND ACTIVE DYNAMIC LIQUID CRYSTAL DEVICE USING THE RED PHOSPHOR

This application claims the priority of Korean Patent Application No. 2003-77185, filed on Nov. 1, 2003, in the Korean Intellectual Property Office, the disclosure of which is incorporated herein in its entirety by reference.

BACKGROUND OF THE INVENTION

1. Field of the Invention

The present invention relates to a red phosphor, and more particularly to a red phosphor with high emission efficiency, a method of preparing the red phosphor, and a red light emitting diode, a white light emitting diode, and an active dynamic liquid crystal device using the red phosphor.

2. Description of the Related Art

White light emitting diodes (LEDs) have a longer lifetime than incandescent light bulbs (a popular type 60 W) can be manufactured in small sizes, and operated at a low voltage. Therefore, white LEDs are recognized as an alternative light source in areas such as domestic fluorescent lamps, liquid crystal device (LCD) backlights, and the like.

White LEDs can be manufactured using red, green and blue LEDs. In this case, however, the white LEDs have a high manufacturing cost, and are bulky due to complex driving circuits. A white LED manufactured by combining a InGaN-based blue LED having a wavelength of 450 nm and a YAG:Ce phosphor has been put to practical use. The white LED is operated by performing the following steps. First, the blue LED emits blue light. A YAG:Ce phosphor is excited by a part of the blue light, emitting a fluorescent yellowish green light. Then, the blue light and the fluorescent yellowish green light combine to form white light. However, this white light has only a portion of the visible range spectrum, which results in a small color rendering index and poor color rendition. In addition, since the blue LED, which is used as a light source in this case, has a wavelength of 450 nm, chip efficiency is low and thus the emission efficiency of the white LED deteriorates.

In order to solve these problems, a UV LED is used as a light source for excitation and a combination of a red phosphor, a green phosphor, and a blue phosphor is used in the manufacturing process of a white LED to obtain nearly natural white light. However, above all, a phosphor that exhibits high emission efficiency when excited by an excitation light source of about 410 nm where chip efficiency is highest is an essential prerequisite.

Currently, conventional blue phosphors and green phosphors have good emission efficiency. However, a red phosphor that exhibits high emission efficiency when excited by a UV excitation light source must be developed as soon as possible since red phosphors have poor emission efficiency.

In addition, the introduction of the phosphor that exhibits high efficiency when excited by long-wavelength UV can facilitate the improvement of an active dynamic LCD. In the active dynamic LCD, light emitted from a rear light source passes through a polarizer and then through a liquid crystal layer. The liquid crystal layer transmits or does not transmit the rear light depending on its orientation. As a result, the rear light is polarized in a predetermined manner. This polarized light excites a corresponding phosphor which then emits light. Thus, an image is formed on a front glass substrate. The active dynamic LCD has a simple structure and can be easily manufactured compared to conventional color LCDs. However, the active dynamic LCD is not commercially available due to low emission brightness of conventional red phosphors. In particular, in the active dynamic LCD, the rear light source must be long-wavelength UV of 390 nm or greater to protect the liquid crystal. A competitive candidate for the rear light source is the UV LED. Therefore, the development of a red phosphor that exhibits high efficiency when exited by long-wavelength UV light will contribute to the development of the active dynamic LCD as well as to the improvement of the red LED and the white LED.

Currently, $3.5MgO0.5MgF_2GeO_2$:Mn, $K_5Eu(WO_4)_{6.25}$ is used as the red phosphor for long-wavelength UV. However, $3.5MgO0.5MgF_2GeO_2$:Mn, $K_5Eu(WO_4)_{6.25}$ exhibits low emission brightness, and low emission efficiency when excited by an excitation light source of 400 nm or greater.

SUMMARY OF THE INVENTION

The present invention provides a red phosphor that exhibits high emission efficiency when excited by a long-wavelength UV excitation light source.

The present invention also provides a method of manufacturing the red phosphor.

The present invention also provides a red light emitting diode (LED) including the red phosphor.

The present invention also provides a white LED including the red phosphor.

Further, the present invention also provides an active dynamic liquid crystal device (LCD) including the red phosphor.

According to an aspect of the present invention, there is provided a red phosphor represented by formula 1:

$$(Li_{(2-z)-x}M_x)(MoO_4)_y:Eu_z,Sm_q \qquad (1)$$

where M is an element selected from K, Mg, Na, Ca, Sr, and Ba, $0 \leq x \leq 2$, $0.5 \leq y \leq 5$, $0.01 \leq z \leq 1.5$, and $0.001 \leq q \leq 1.0$.

According to an another aspect of the present invention, there is provided a method of manufacturing the red phosphor, the method including mixing and dispersing in a volatile polar solvent a compound selected from an oxide, carbonate, chloride, hydroxide, sulfate, fluoride, nitrate, and acetate of Li, Eu, Mo, and Sm; and performing calcination of the mixed slurry at 600-1400° C.

According to still another aspect of the present invention, there is provided a red LED manufactured by combining a red phosphor represented by formula 1 and a 380-420 nm UV LED.

According to yet another aspect of the present invention, there is provided a white LED manufactured by combining a phosphor combination of a red phosphor represented of formula 1, a green phosphor, and a blue phosphor and a 380-420 nm UV LED.

According to a further aspect of the present invention, there is provided an active dynamic LCD including a front glass substrate having a phosphor pattern including the red phosphor represented by formula 1, a liquid crystal layer, and a rear light source.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A red phosphor according to an embodiment of the present invention is manufactured using a Li ($MoO_4$) based material as a starting material to obtain high emission efficiency when excited by a long-wavelength ultra-violet (UV) light (380-420 nm). This is contrary to conventional potassium-tungsten and sodium-tungsten based red phosphors. Specifically, in a method of manufacturing the red phosphor, Li ($MoO_4$) is used as a starting material, Eu is used as an active agent that generates red light, and $Sm_2O_3$ is added as a recovering agent. As a result, the red phosphor according to the present invention can have high emission characteristics when excited by long-wavelength UV of, for example, 400-410 nm, compared to existing red phosphors. In addition, lithium contained in the Li ($MoO_4$) can be replaced with at least an element selected from K, Mg, Na, Ca, Sr, and Ba to change the emission characteristics and physical properties of the red phosphor.

The red phosphor according to an embodiment of the present invention may be mixed with a proper amount of a conventional red phosphor (3.5MgO0.5$MgF_2GeO_2$:Mn) (deep red phosphor) to control brightness and color purity.

The red phosphor represented by formula 1 can be manufactured by a solid phase method, a liquid phase method, or a vapour phase method, but is not limited thereto. The solid phase method of manufacturing the red phosphor includes mixing in a volatile polar solvent a compound selected from an oxide, carbonate, chloride, hydroxide, sulfate, fluoride, nitrate, and acetate of Li, Eu, Mo, and Sm and then performing calcination of the mixed solution at 600-1400° C. For example, lithium carbonate ($Li_2CO_3$), Eu oxide ($Eu_2O_3$), Mo oxide ($MoO_3$), and Sm oxide ($Sm_2O_3$) are mixed and diffused in a volatile polar solvent. Next, the mixed solution is subjected to calcination in a reactor of, for example, alumina at 600-1400° C. Finally, the compound was washed and the result is a red phosphor. If the calcination temperature is lower than 600° C., less crystals are formed. If the calcination temperature exceeds 1400° C., the phosphor dissolves, thus causing a decrease in emissivity and making it difficult to obtain powder with the desired physical properties. Depending on the source materials, the calcination process can be performed in an air atmosphere or a reducing atmosphere.

The calcination step may be performed in a period of 1-10 hours. If the calcination time is less than 1 hour, less crystals are formed. If the calcination time exceeds 10 hours, powder becomes large, resulting in a decrease in emissivity, which is also undesirable.

The volatile polar solvent may be acetone or ethanol, but is not limited thereto.

Figure 1:
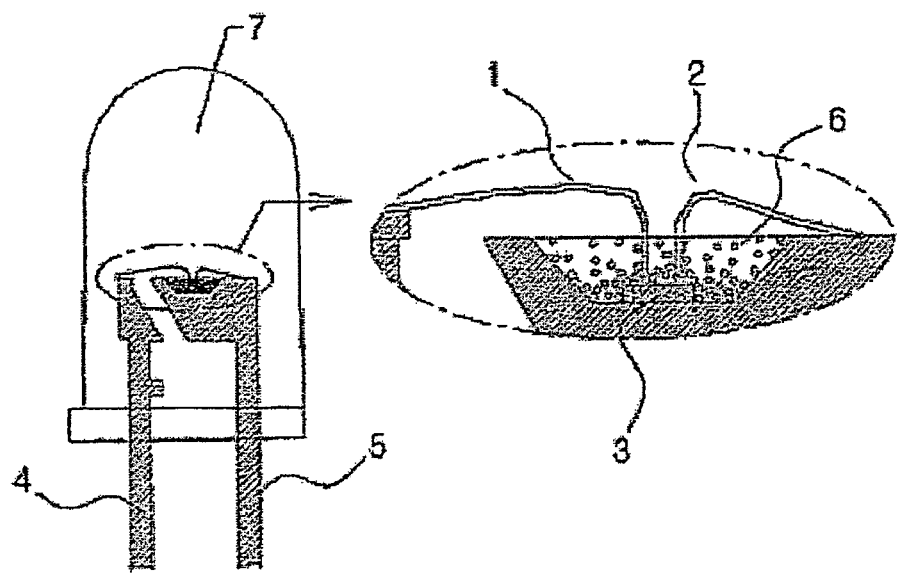
FIG. 1 is a schematic diagram illustrating a red light emitting diode (LED) according to an embodiment of the present invention.

The red light emitting diode (LED) according to the present invention is manufactured by injecting a phosphor into a cup-like container with a reflective substrate. Referring to FIG. 1, an epoxy mold layer 6 including the red phosphor (represented by formula 1) is formed above an LED chip 3 which has emission characteristics when exited by long-wavelength UV of 380-420 nm. An anode lead 4 and a cathode lead 5 are both connected to the LED chip 3 via an anode wire 1 and a cathode wire 2, respectively. A wrapping material 7 molds and encapsulates the epoxy mold layer 6 and its vicinity with a colorless or colored light transmissive resin.

Also, a white LED according to an embodiment of the present invention has the same structure as the red LED, except that a RGB phosphor combination of a green phosphor, a blue phosphor, and the red phosphor is used.

The green phosphor may be aluminates such as $BaMgAl_{10}O_{17}$:$Mn^{2+}$, chlorosillicates such as $Ca_8Mg(SiO_4)Cl_2$:$Eu^{2+}$,$Mn^{2+}$, and the like, but is not limited thereto. Preferably, the green phosphor may be $(Ba_{1-x}Sr_x)SiO_4$:$Eu^{2+}$ ($0 \leq x \leq 1$).

The blue phosphor may be an aluminates such as $BaMg_2Al_{16}O_{27}$:$Eu^{2+}$ or $BaMgAl_{10}O_{17}$:$Eu^{2+}$. Preferably, the blue phosphor may be $(Sr_x(Mg,Ca)_{1-x})_5PO_4Cl$:$Eu^{2+}$ ($0 \leq x \leq 1$).

The white LED according to an embodiment of the present invention has a color rendering index of 90 or greater, which is larger than conventional white LEDs manufactured by combining a conventional blue LED and a YAG:Ce phosphor. Therefore, when the white LED according to an embodiment of the present invention is used for illumination, light with superior color rendition approximating natural light is obtained.

Figure 2:
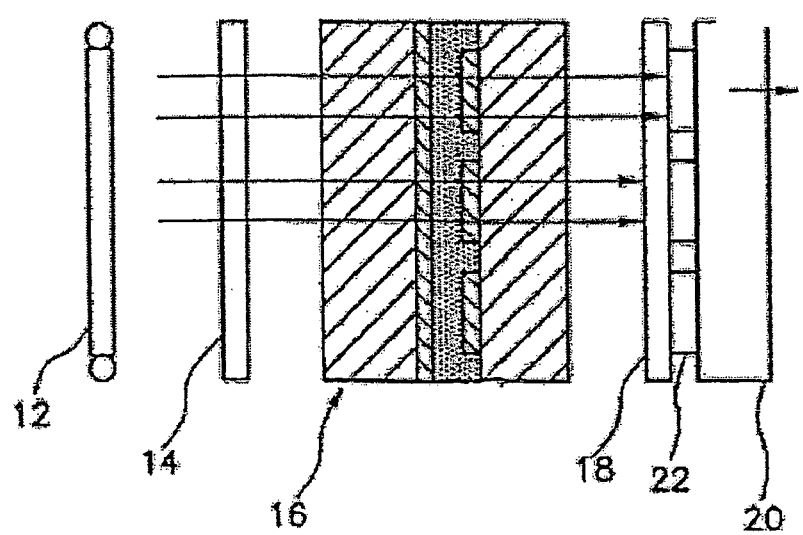
FIG. 2 is a schematic diagram illustrating an active dynamic liquid crystal device (LCD) according to an embodiment of the present invention.

FIG. 2 is a schematic diagram illustrating an active dynamic liquid crystal device (LCD) according to the present invention. FIG. 2 illustrates a common structure of an active dynamic LCD. Referring to FIG. 2, 380 nm -420 nm light is discharged from a rear light source 12 and passes through a polarizer 14 and then through liquid crystal layer 16. The liquid crystal layer 16 performs a switching operation on the light. Then, the light is irradiated to a predetermined fluorescent film 22 formed on a front glass substrate 20 via an analyzer 18. The fluorescent film 22 is excited and emits light. The fluorescent film 22 includes the red phosphor manufactured according to the present invention.

The present invention will be described in further detail with reference to the following examples. The following examples are for illustrative purposes and are not intended to limit the scope of the invention.

PRELIMINARY EXAMPLE 1

Manufacture of $Li_{(2-z)}(MoO_4)_2$:$Eu_z$ Phosphor $Li_2CO_3$, $Eu_2O_3$, and $MoO_3$ were prepared as precursors of lithium, Eu, and Mo. $Li_2CO_3$, $Eu_2O_3$, and $MoO_3$ were mixed in a proper stoichiometric ratio with an acetone solvent in a mortar. The resultant slurry was placed in an alumina reactor to be subjected to calcination in the presence of air at 600~1000° C. for 3 hours. The calcination result was washed with distilled water. The amount of the active material Eu, which is denoted by the z value, varies in the range of 0.01-1.3. Optimum emission characteristics occurred when the value of z was 0.8. When the value of z is greater than 0.8, a concentration calcination phenomenon occurs, decreasing emission. When the concentraion of Eu is smaller than 0.8, the concentration of the active agent is too low, decreasing emission intensity. Optimum emission characteristics appeared when the calcination temperature was 900° C. When the calcination temperature was lower than 900° C., less crystals were formed and particles were thinner, thus decreasing emission intensity. When the calcination temperature was greater than 900° C., particles became coarsened and the emission area was reduced, thus decreasing emission intensity.

EXAMPLES 1-5

Manufacture of the $Li_{(2-z)}(MoO_4)_2:Eu_z,Sm_q$ Phosphor

Figure 3:
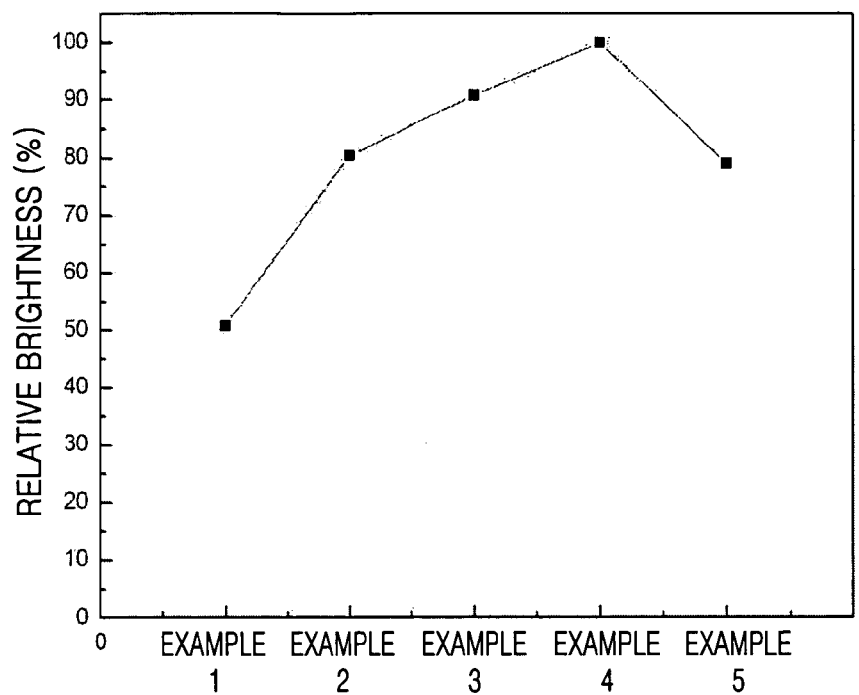
FIG. 3 illustrates the change of relative brightness of a red phosphor when the amount of Eu is fixed and the amount of Sm varies.

In this process, red phosphors were manufactured in the same manner as in Preliminary Example 1, except that the amount of Eu (z) was fixed to 0.8 and the amount of Sm (q) varied as shown in Table 1. Relative emission intensity of the red phosphors was measured using an excitation light source of 394 nm. The results are shown in FIG. 3.

TABLE 1

Variation of amount of Sm in red phosphor

| | Amount of Sm(q) |
|---|---|
| Example 1 | 0.02 |
| Example 2 | 0.04 |
| Example 3 | 0.06 |
| Example 4 | 0.08 |
| Example 5 | 0.10 |

As is apparent in FIG. 3, the relative emission intensity was greatest in Example 4 where the amount of Sm (q) was 0.08.

EXAMPLES 6-10

Manufacture of the $Li_{(2-z)}(MoO_4)_2:Eu_z,Sm_q$ Phosphor

Figure 4:
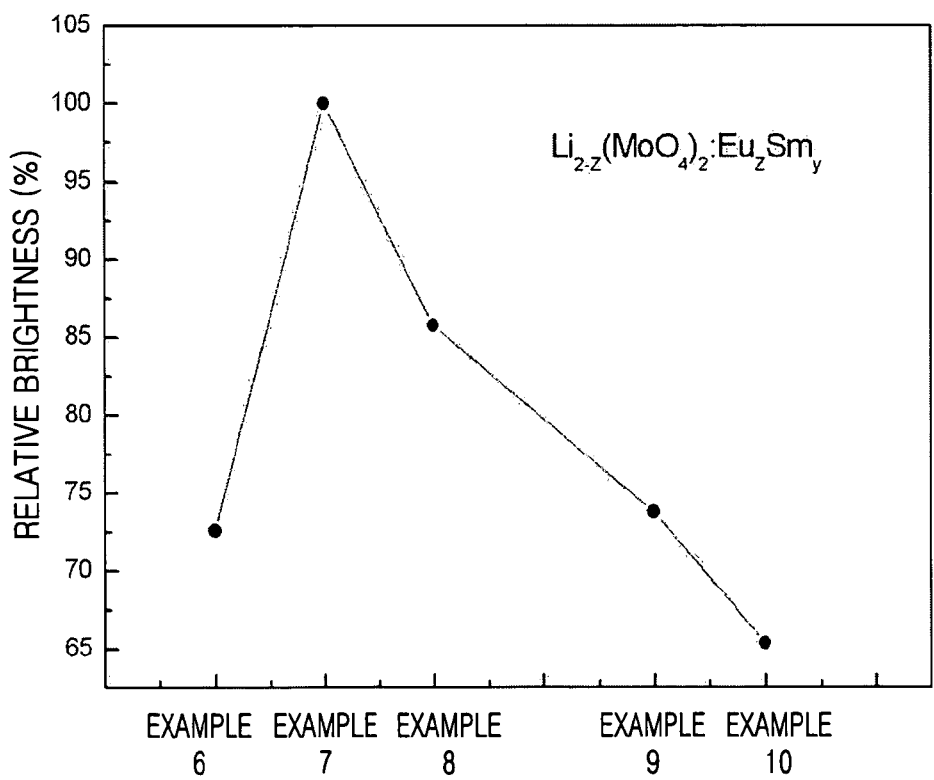
FIG. 4 illustrates the change of relative brightness of a red phosphor when the amount of Sm is fixed and the amount of Eu varies.

Red phosphors were manufactured in the same manner as in Example 1, except that the amount of Sm (q) was fixed to 0.08 and the amount of Eu (z) varied as shown in Table 2. Relative emission intensity of the red phosphors was illustrated in FIG. 4. As is apparent in FIG. 4, the relative emission intensity was greatest in Example 7:

TABLE 2

Variation of amount of Eu in red phosphor

| | Amount of Eu (z) |
|---|---|
| Example 6 | 0.7 |
| Example 7 | 0.8 |
| Example 8 | 0.9 |
| Example 9 | 1.0 |
| Example 10 | 1.1 |

EXAMPLE 11

Manufacture of the $Na_{1.2}Eu_{0.8}(MoO_4)_2:,Sm_{0.08}$ Phosphor

Figure 5:
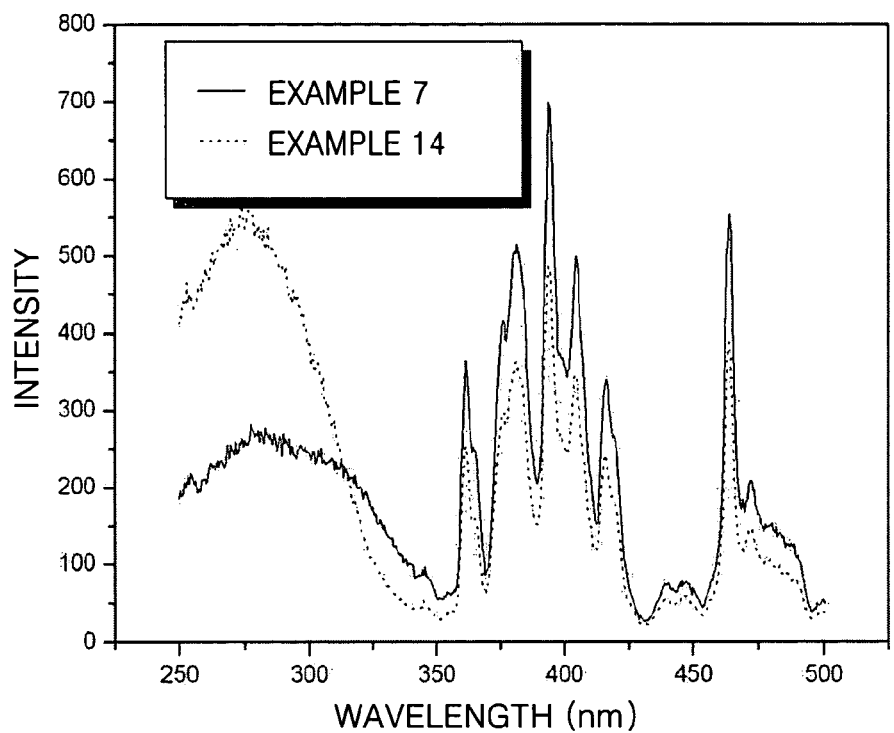
FIG. 5 is the absorption spectrum of Examples 7 and 11.

A red phosphor was manufactured in the same manner as in Preliminary Example 1, except that the amount of Eu (z) was fixed to 0.8, the amount of Sm (q) was fixed to 0.08, and Na was used instead of Li. FIG. 5 is the absorption spectra of the red phosphors described in Examples 7 and 11. The absorption spectra each have sharp peaks at the wavelength of 362, 382, 394, 417 and 465 nm. In particular, at 405 nm the peak height of Examples 7 was larger than that of Example 11, which includes Na instead of Li.

Performance Test 1

Observation of Absorption Spectrum

Figure 6:
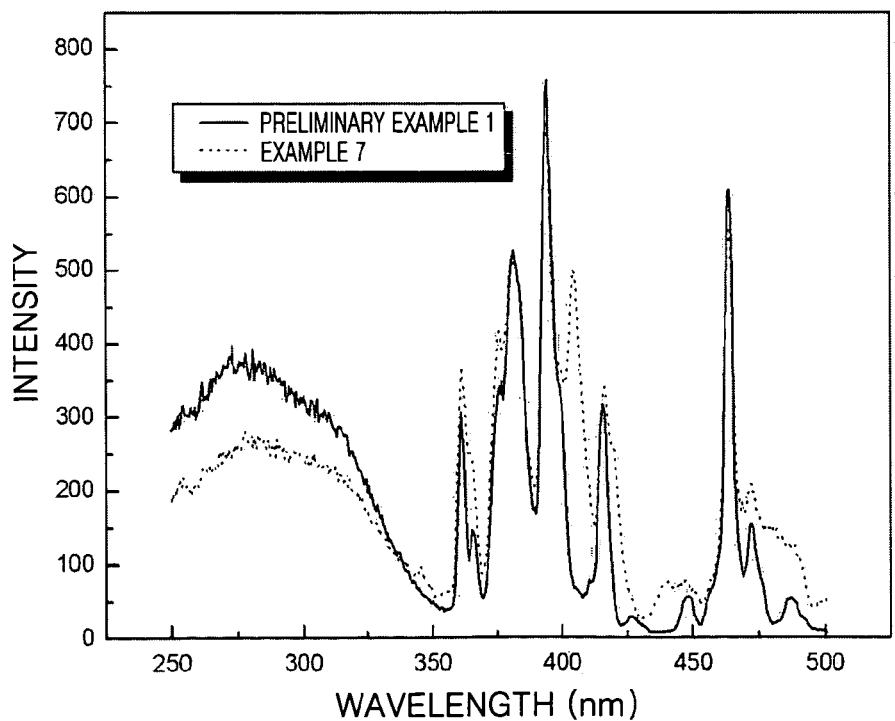
FIG. 6 is another absorption spectrum of Example 7 and Preliminary Example 1 red phosphors.

FIG. 6 is the absorption spectra of the red phosphors described in Preliminary Example 1 and Example 7. The absorption spectra each have sharp peaks at the wavelengths of 362, 382, 394, 417, and 465 nm. In particular, at 405 nm the peak height of Example 7 was larger than that of Preliminary Example 1 which was not doped with Sm.

Performance Test 2

Observation of Absorption Spectrum

Figure 7:
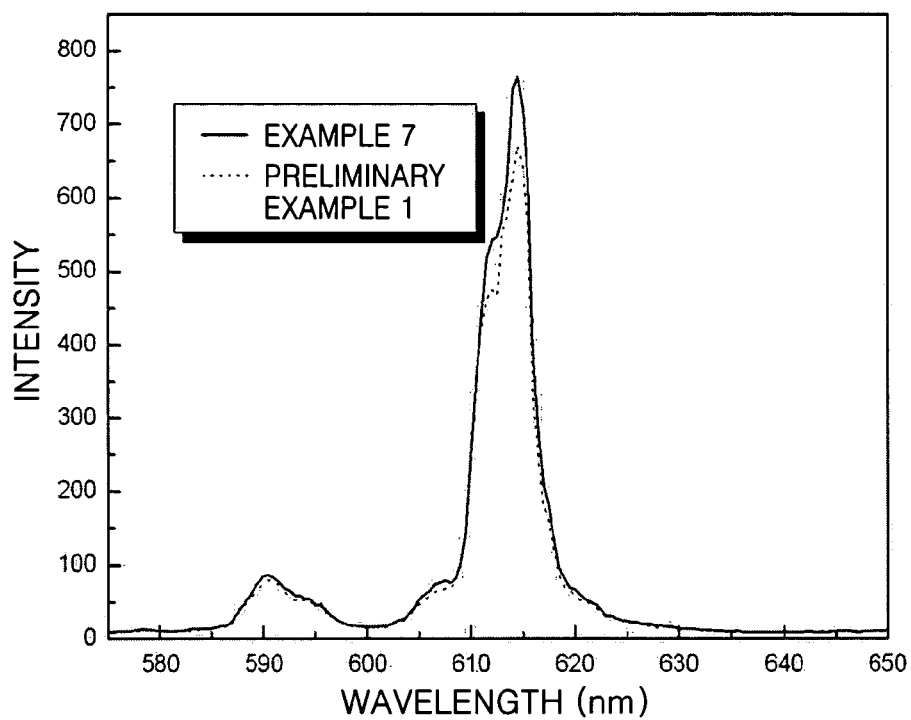
FIG. 7 is the emission spectrum of Preliminary Example 1 and Example 7 red phosphors when excited by a 394 nm wavelength excitation light source.
Figure 8:
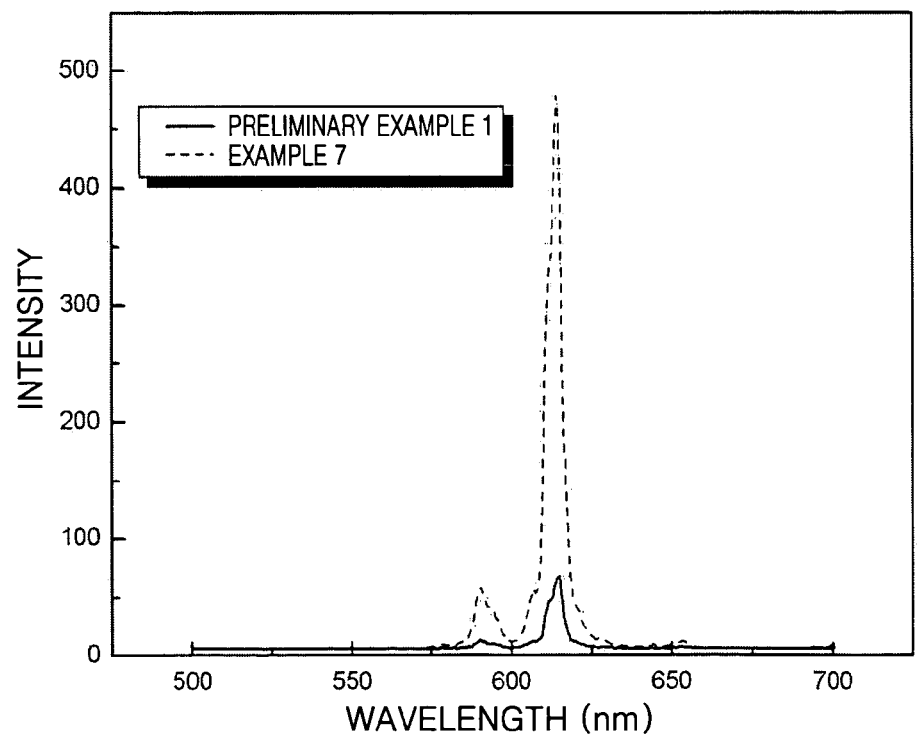
FIG. 8 is the emission spectrum of Preliminary Example 1 and Example 7 red phosphors when excited by a 405 nm wavelength excitation light source.

The phosphors manufactured in Preliminary Example 1 and Example 7 were excited by an excitation energy source of 394 nm and light emitted. The results are shown in FIG. 7. Also, the phosphors were excited by an excitation energy source of 405 nm and light emitted. The results are shown in FIG. 8. With reference to FIG. 8, it was confirmed that at a wavelength of 405 nm the peak height of Example 7-in which Sm was used-was 6 times greater than that of Preliminary Example 1 where Sm was not used.

EXAMPLE 12

Manufacture of Red LED

Figure 9:
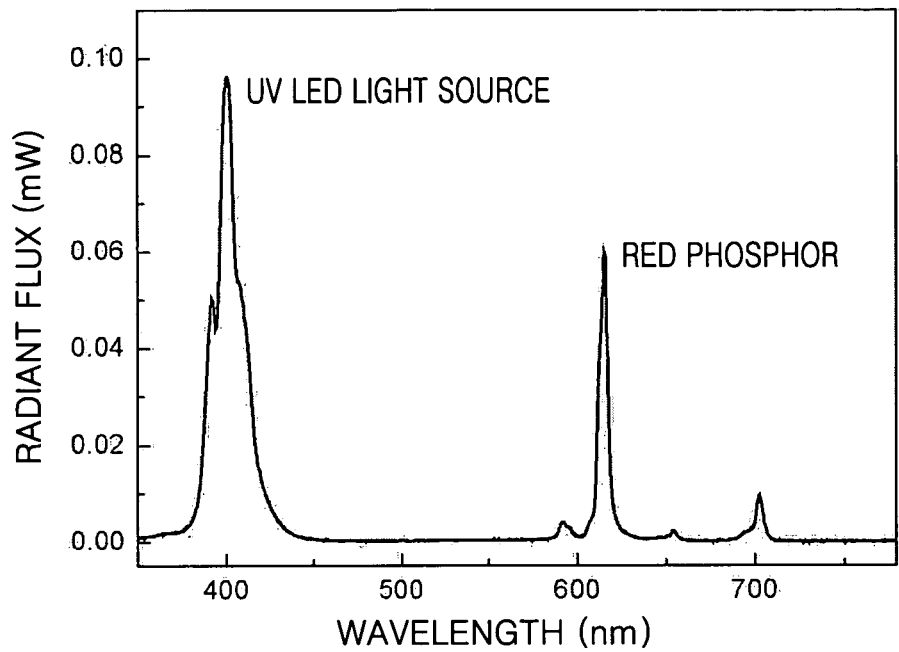
FIG. 9 is the emission spectrum of a red LED according to Example 12.

A red LED was manufactured using the red phosphor described in Example 7. The red LED has a conventional structure illustrated in FIG. 1. FIG. 9 is the emission spectrum of the red LED. Referring to FIG. 9, when an excitation energy source of 400 nm or greater was used, the red LED according to the present invention has high emission efficiency compared to a conventional red phosphor.

EXAMPLE 13

Manufacture of White LED

Figure 10:
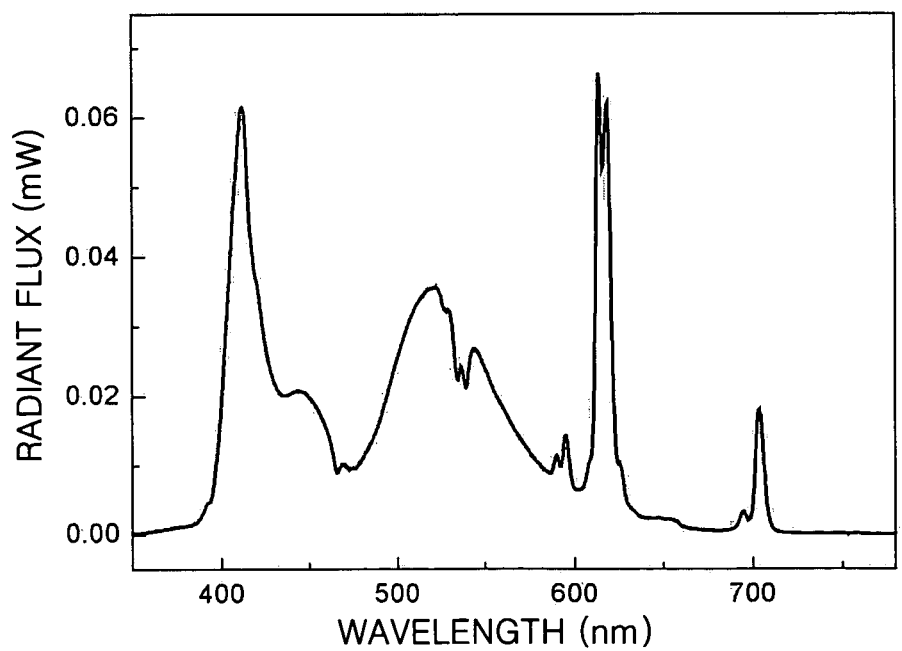
FIG. 10 is the emission spectrum of a white LED according to Example 13.

First, a mixed phosphor was prepared by mixing $(Sr_x(Mg, Ca)_{1-x})5PO_4Cl:Eu^{2+}$ as a blue phosphor, $(Ba_{1-x}Sr_x)SiO_4:Eu^{2+}$ as a green phosphor, the phosphor described in Example 7 as a red phosphor in a weight ratio of 2:1:15. The mixed phosphor and an epoxy resin were mixed in a weight ratio of 1:2. A UV LED was coated with the resultant mixture to produce a white LED. The emission spectrum of the white LED is illustrated in FIG. 10. As is apparent in FIG. 10, the emission spectrum of the white LED has distinguished peaks in a blue wavelength range, a green wavelength range, and a red wavelength range, contrary to that of a conventional white LED. The result implies that the white LED according to the present embodiment has superior color reproducing capability.

A red phosphor according to the present invention exhibits emission characteristics of high brightness when excited by, in particular, an excitation light source of around 405 nm. The brightness of the red phosphor is 6 times stronger than that of a conventional phosphor. Therefore, the red phosphor can be used in a red LED and a white LED that have a UV excitation light source and an active dynamic LCD. In addition, the white LED according to the present invention has a color rendering index of 90 or greater and so has excellent color rendition.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A red phosphor represented by formula 1:

$$(Li_{(2-z)-x}M_x)(MoO_4)_y:Eu_z,Sm_q \quad (1)$$

where M is an element selected from K, Mg, Na, Ca, Sr, and Ba, $0 \leq x \leq 2$, $0.5 \leq y \leq 5$, $0.01 \leq z \leq 1.5$, and $0.001 \leq q \leq 1.0$.

2. A method of manufacturing a red phosphor, the method comprising:

preparing a mixed slurry by dissolving in a volatile polar solvent a compound selected from the group consisting of an oxide, carbonate, chloride, hydroxide, sulfate, fluoride, nitrate, and acetate of Li, Eu, Mo, and Sm;

performing calcination of the mixed slurry at 600-1400° C.; and washing the calcination result.

3. The method of claim 2, wherein the volatile polar solvent is acetone or ethanol.

4. The method of claim 2, wherein the calcination is performed for a period of 1-10 hours.

5. A red light emitting diode (LED) manufactured by combining the red phosphor of claim 1 and a 380-420 nm UV LED.

6. A white LED manufactured by combining a phosphor combination of the red phosphor of claim 1, a green phosphor, and a blue phosphor and a 380-420 nm UV LED.

7. The white LED of claim 6, wherein the green phosphor is $(Ba_{1-x}Sr_x)SiO_4:Eu^{2+}(0 \leq x \leq 1)$.

8. The white LED of claim 6, wherein the blue phosphor is $(Sr_x(Mg,Ca)_{1-x})_5PO_4Cl:Eu^{2+}(0 \leq x \leq 1)$.

9. An active dynamic liquid crystal device (LCD) comprising:

a front glass substrate having a phosphor pattern, which includes including the red phosphor of claim 1;

a liquid crystal layer; and a rear light source.

* * * * *